(12) United States Patent
Mehr et al.

(10) Patent No.: US 7,595,641 B1
(45) Date of Patent: Sep. 29, 2009

(54) ELECTRONIC NMR REFERENCE SIGNAL SYSTEMS AND METHODS

(75) Inventors: Knut G. Mehr, San Francisco, CA (US); Daina Zofija Avizonis, Redwood City, CA (US); John Mark Dixon, San Francisco, CA (US); Boban Kuriakose John, Fremont, CA (US)

(73) Assignee: Varian, Inc., Palo Alto, CA (US)

( * ) Notice: Subject to any disclaimer, the term of this patent is extended or adjusted under 35 U.S.C. 154(b) by 39 days.

(21) Appl. No.: 12/044,872

(22) Filed: Mar. 7, 2008

(51) Int. Cl.
*G01V 3/00* (2006.01)
(52) U.S. Cl. ...................... 324/322; 324/318
(58) Field of Classification Search ............ 324/322, 324/318
See application file for complete search history.

(56) References Cited

U.S. PATENT DOCUMENTS

| | | | | |
|---|---|---|---|---|
| 5,552,710 A | * | 9/1996 | Busse-Grawitz et al. | 324/322 |
| 6,304,085 B2 | * | 10/2001 | Kuth et al. | 324/322 |
| 7,009,394 B2 | | 3/2006 | Ross | |
| 7,064,544 B1 | * | 6/2006 | Schirmer | 324/307 |
| 7,132,830 B2 | * | 11/2006 | Habara et al. | 324/318 |

FOREIGN PATENT DOCUMENTS

FR 2735865 A1 12/1996

OTHER PUBLICATIONS

Akoka, et al., "Concentration Measurement by Proton NMR Using the Eretic Method", Abstract, Jul. 1, 1999, 1pg.
Hoult, et al., "The Slgnal-to-Noise Ratio of the Nuclear Magnetic Resonance Experiment", Journal of Magentic Resonance 24, 71-85 (1976).
"Quantitative NMR by the Eretic Method", Dec. 5, 2007, 2pgs.
Upton, "Quantitative NMR in Research Chemistry", GlasoSmithKline R&D, 38pgs.

* cited by examiner

*Primary Examiner*—Louis M Arana
(74) *Attorney, Agent, or Firm*—Bella Fishman; Andrei D. Popovici

(57) ABSTRACT

According to some embodiments, a synthetic nuclear magnetic resonance (NMR) reference signal is injected into the receive path of an NMR spectrometer, after the NMR probe and before the receive amplifier. The synthetic signal is generated using a transmit path for the same channel or for a different channel than the reference signal detection channel. The reference signal is coupled from a transmit-path reference signal coupler situated before a transmit amplifier to a receive-path reference signal coupler situated between the probe and the receive amplifier. The reference signal couplers may include passive directional couplers and/or active switches. The synthetic signal samples the receive path of the system but is not substantially affected by intra-probe interactions. Using a well-defined existing NMR channel to generate the reference signal allows superior control of reference signal characteristics, and does not require a dedicated spare channel for the reference signal.

23 Claims, 5 Drawing Sheets

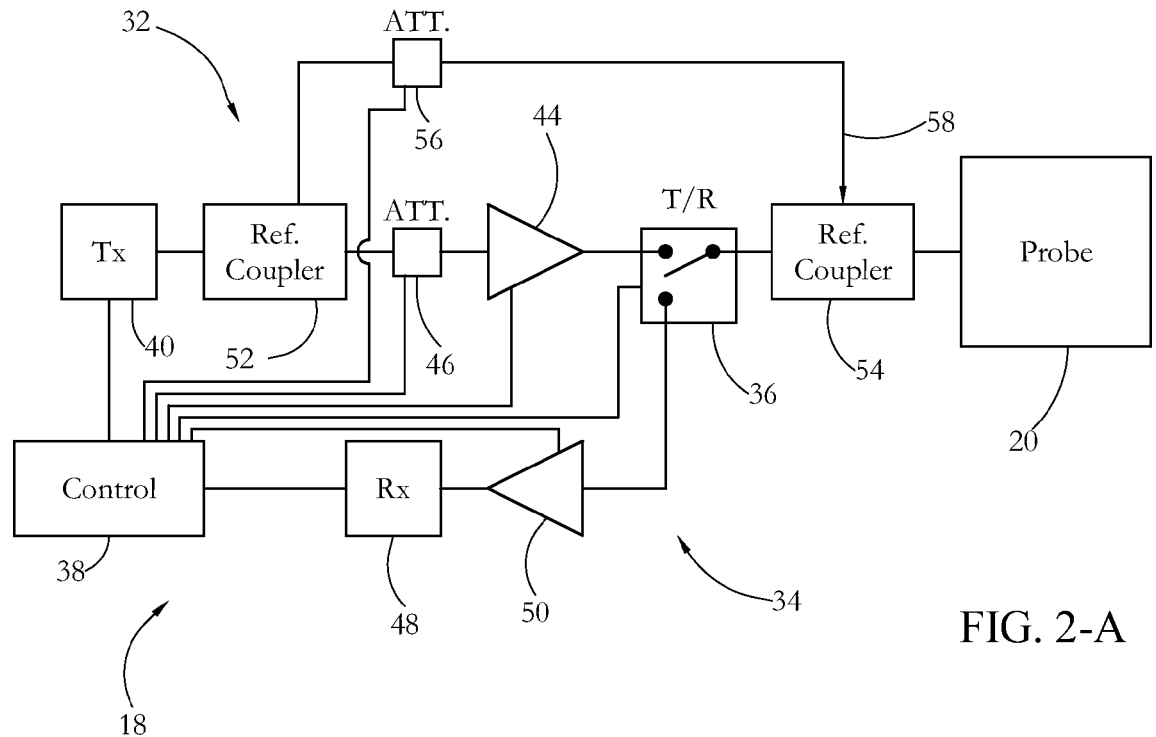
FIG. 2-A
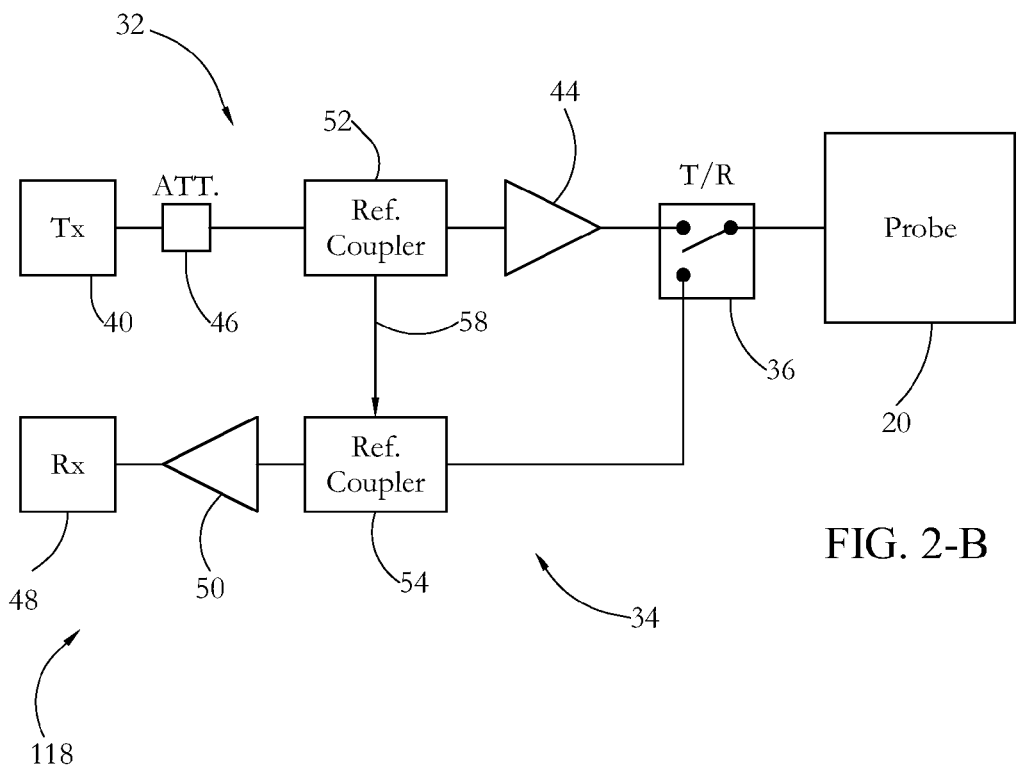
FIG. 2-B

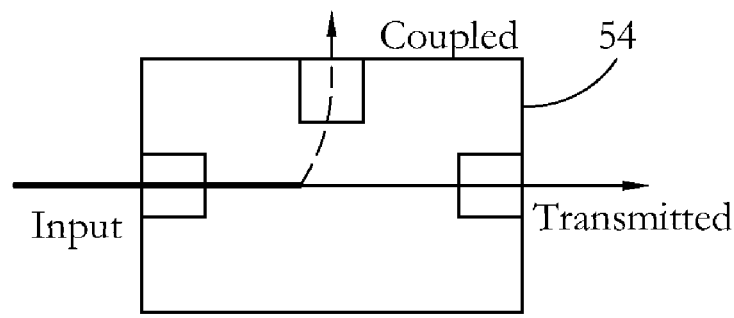
FIG. 5-A
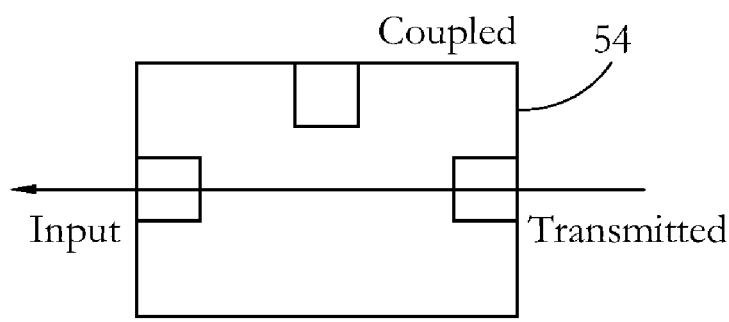
FIG. 5-B
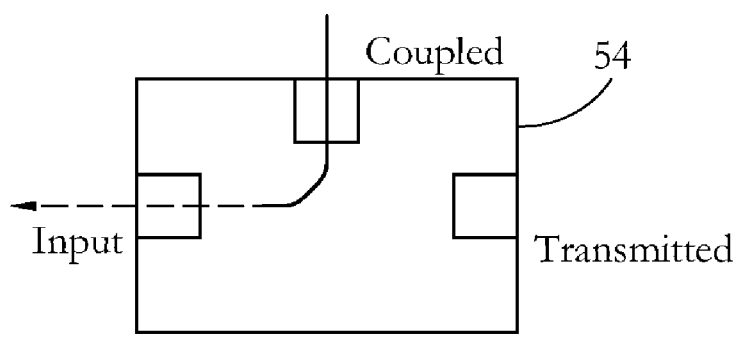
FIG. 5-C

ELECTRONIC NMR REFERENCE SIGNAL SYSTEMS AND METHODS

FIELD OF THE INVENTION

This invention relates to magnetic resonance system and methods, and in particular to systems and methods for generating NMR reference signals for quantitative spectroscopic analysis.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF together with its associated circuitry can resonate at the Larmor frequency of a nucleus of interest present in the sample. The RF coils are typically provided as part of an NMR probe, and are used to analyze samples situated in sample tubes or flow cells.

An NMR frequency of interest is determined by the nucleus of interest and the strength of the applied static magnetic field $B_0$. In order to maximize the sensitivity of NMR measurements, the resonant frequency of the excitation/detection circuitry is set to be equal to the frequency of interest. The resonant frequency of the excitation/detection circuitry varies as $$\nu = \frac{1}{2}\pi \sqrt{LC} \qquad [1]$$

where L and C are the effective inductance and capacitance, respectively, of the excitation/detection circuitry.

The chemical shift of a nucleus is the normalized difference between the resonance frequency of the nucleus and a standard, normalized to the standard. Chemical shifts expressed in ppm may be determined according to the relation:

$$\delta = \frac{(\nu - \nu_{REF}) \times 10^6}{\nu_{REF}} \qquad [2]$$

wherein $\nu_{REF}$ is the resonance frequency of a reference (standard) nucleus. Common standards employed in NMR spectroscopy include tetramethylsilane (TMS) and 2,2-dimethyl-2-silapentane-5-sulfonic acid (DSS), among others. The reference (standard) resonance frequency is often measured by adding the standard compound (e.g. TMS) to the sample of interest.

For many applications, it may be impractical to add a standard compound to the sample of interest. For example, adding a standard compound may be unacceptable for some biological samples, or for samples that include molecules that react with the standard or whose reactivity with the standard is unknown. Other experiments cannot tolerate any additive, such as IC50 measurements requiring samples to be analyzed for subsequent in-vivo applications.

In the article "Concentration Measurement by Proton NMR using the ERETIC Method," *Analytical Chemistry* 71(13): 2554-2557, July 1999, Akoka et al. describe a method, named ERETIC (Electronic REference To access In vivo Concentrations), in which a reference signal is synthesized by an electronic device. Akoka et al. also describe NMR synthetic reference systems and methods in French Patent Publication No. 2 735 865 A1. Known NMR systems and methods employing electronically-synthesized reference signals commonly employ a spare probe channel to couple the reference signals into the observe channel, and may allow limited control over system parameters.

SUMMARY OF THE INVENTION

According to one aspect, a nuclear magnetic resonance (NMR) apparatus comprises a NMR probe; a transmit circuit comprising a transmit amplifier, for applying a set of NMR pulses to the NMR probe; a receive circuit comprising a receive amplifier, for detecting a response of the NMR probe to the set of applied NMR pulses; a transmit/receive switch electrically connecting the NMR probe alternatively to the transmit circuit and to the receive circuit, the transmit/receive switch being switchable between a receive state and a transmit state; and a receive-path reference signal coupler situated in a receive path between the NMR probe and the receive amplifier, for coupling a synthetic NMR reference signal into the receive path.

According to another aspect, a NMR apparatus comprises a NMR probe; a receive circuit comprising a receive amplifier, for detecting a response of the NMR probe to the set of applied NMR pulses; and a receive-path reference signal coupler situated in a receive path between the NMR probe and the receive amplifier, for coupling a synthetic NMR reference signal into the receive path.

According to another aspect, a NMR measurement method comprises employing a transmit path to apply a set of NMR measurement pulses to a NMR probe during a transmit phase; employing a receive path to detect a response of the NMR probe to the applied NMR measurement pulses during a receive phase; and coupling a synthetic NMR reference signal into a receive-path reference signal coupler during the receive phase, the reference signal coupler being situated between the NMR probe and a receive amplifier of the receive path, whereby the synthetic NMR reference signal does not pass through the NMR probe.

BRIEF DESCRIPTION OF THE DRAWINGS

The foregoing aspects and advantages of the present invention will become better understood upon reading the following detailed description and upon reference to the drawings where:

FIG. 2-A shows a single-channel synthetic-reference NMR measurement circuit according to some embodiments of the present invention.

FIG. 2-B shows another single-channel synthetic-reference NMR measurement circuit according to some embodiments of the present invention.

FIG. 5-A illustrates an exemplary signal path for a signal incident on an input port of a passive directional coupler, according to some embodiments of the present invention.

FIG. 5-B illustrates an exemplary signal path for a signal incident on a transmitted port of a passive directional coupler, according to some embodiments of the present invention.

FIG. 5-C illustrates an exemplary signal path for a signal incident on a coupled port of a passive directional coupler, according to some embodiments of the present invention.

DETAILED DESCRIPTION OF THE INVENTION

The following description illustrates the present invention by way of example and not necessarily by way of limitation. Any reference to an element is understood to refer to at least one element. A set of elements is understood to include one or more elements. A plurality of elements includes at least two elements. Each recited element or structure can be formed by or be part of a monolithic structure, or be formed from multiple distinct structures. Any recited electrical or mechanical connections can be direct connections or indirect operative connections established through intermediary circuit elements or structures.

The following description illustrates embodiments of the invention by way of example and not necessarily by way of limitation.

Figure 1:
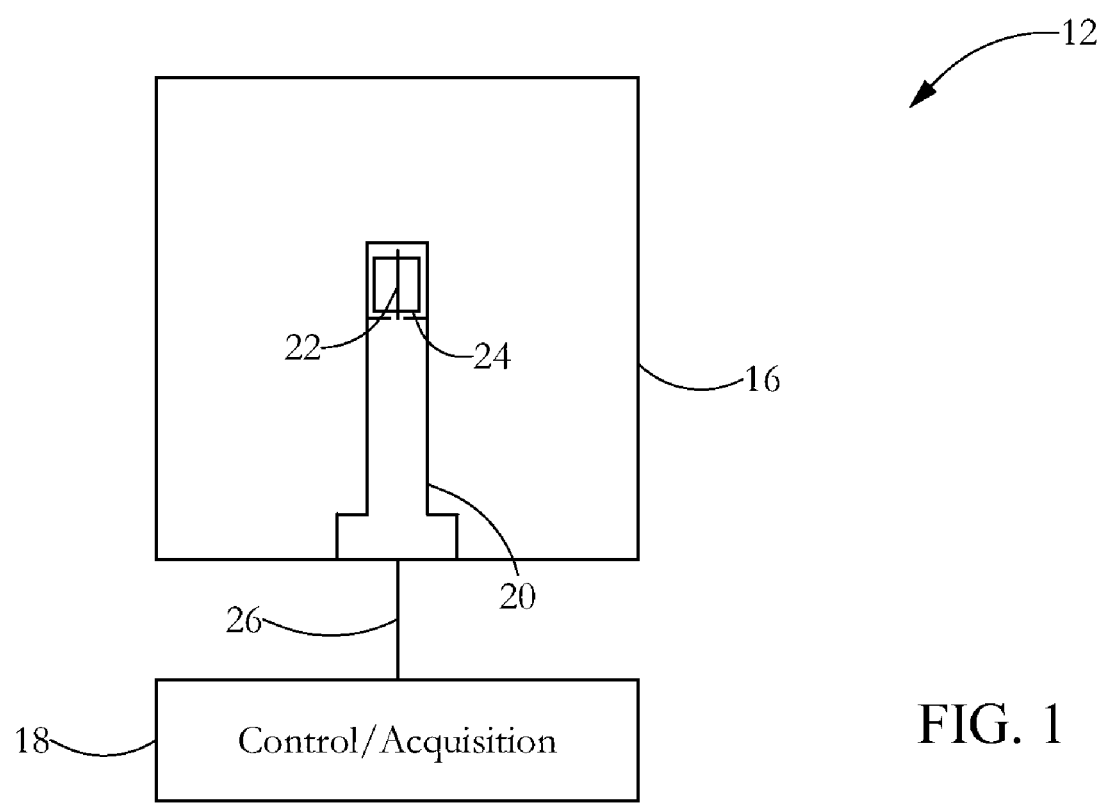
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include other similar coils. In some embodiments, coil 24 is an X-coil (non-proton coil) such as a $^{13}C$ coil. In some embodiments, coil 24 may be a proton coil.

A sample container 22 is positioned within probe 20, for holding a NMR sample of interest within coil 24 while measurements are performed on the sample. Sample container 22 may be a sample tube or a flow cell. A number of electrical circuit components such as capacitors, inductors, and other components are situated in a circuit region of probe 20, and are connected to coil 24.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. An NMR circuit including coil 24 is used to apply radio-frequency magnetic fields $B_1$ to the sample, and to measure the response of the sample to the applied magnetic fields. The RF magnetic fields are perpendicular to the static magnetic field.

FIG. 2-A shows a schematic diagram of a NMR measurement system including control/acquisition system 18 and probe 20, according to some embodiments of the present invention. The NMR measurement system may include components not shown in FIG. 2-A for simplicity; such components may include, among others, tuning couplers, bias tees, fixed and/or variable attenuators, bandpass and/or other filters, and other known components.

Control/acquisition system 18 includes a transmit circuit 32, a receive circuit 34, a transmit/receive (T/R) switch 36 alternatively connecting transmit circuit 32 and receive circuit 34 to probe 20, a controller 38, and a reference signal coupling circuit including a transmit-path reference signal coupler 52, a receive-path reference signal coupler 54, and a reference signal attenuator 56. Reference signal couplers 52, 54 are interconnected by a reference signal coupling connection 58, which bypasses power amplifier 44. Reference signal attenuator 56 is situated along reference signal coupling connection 58, between reference signal couplers 52, 54. Transmit circuit 32 includes a transmitter 40, an attenuator 46 and a power amplifier (transmit amplifier) 44 connected to a transmit port of T/R switch 36. Receive circuit 34 includes a pre-amplifier (receive amplifier) 50 and a receiver 48 connected to a receive port of T/R switch 36.

A transmit path is defined from transmitter 40 to probe 20 in sequence through transmit-path reference signal coupler 52, attenuator 46, power amplifier 44, T/R switch 36, and receive-path reference signal coupler 54. A receive path is defined from probe 20 to a receiver 48 in sequence through receive-path reference-signal coupler 54, T/R switch 36, and pre-amplifier 50. A reference signal path is defined from transmitter 40 to receiver 48 in sequence through transmit-path reference signal coupler 52, reference signal coupling connection 58 and attenuator 56, receive-path reference signal coupler 54, T/R switch 36, and pre-amplifier 50.

Transmitter 40 includes a signal generator including a frequency generator connected to an amplitude and phase modulator. Amplitude modulation may be achieved using a variable attenuator. Transmitter 40 generates NMR measurement pulses during a transmit phase, and synchronized and coherent reference signals during a receive phase, as described below. Transmitter 40 has a high dynamic range, e.g. between 80 and 120 dB, and is capable, through amplitude and phase modulation, to adjust the frequency of the outgoing signals to desired values. In particular, the frequency of synthesized reference signals can be controlled to be away from the resonance frequency of the nuclei of interest. In some embodiments, the attenuator forming part of transmitter 40 is used for fine attenuation adjustments, while attenuator 46 is used for coarse attenuation adjustments.

Attenuator 46 may include an attenuator board and/or associated components for attenuating signals received from transmitter 40. Attenuator 46 may have a dynamic range on the order of 80-100 dB, for example about 80 dB. The attenuation imparted by attenuator 46 may be different during the transmit and receive phases, and may be chosen so as to achieve desired signal levels during each phase. In particular, the attenuation imparted by attenuator 46 may be set to a relatively high value (e.g. −80 dB) during the receive phase in order to limit the leakage of reference signal to power amplifier 44.

Power amplifier 44 may include an amplifier circuit configured to amplify received NMR measurement signals by a factor on the order of 40-70 dB, for example about 60 dB, and transmit the amplified signals to probe 20 through T/R switch 36. T/R switch 36 may include two PIN diodes separated by a quarter-wavelength section of transmission line or an equivalent lumped-element circuit. In some embodiments T/R switch 36 may include passive crossed diodes, which may be used to achieve switching based on signal intensity. Pre-amplifier 50 may include an amplifier circuit configured to amplify received NMR measurement and reference signals and transmit the amplified signals to receiver 48. Pre-amplifier 50 may be chosen to a low-noise amplifier, for example with a noise level on the order of 1 dB or less. Receiver 48 may include filters, amplification stages, down-sampling components, an A/D converter, and analog and/or digital mixer stages. Receiver 48 receives and processes NMR measurement and reference signals to yield digital NMR measurement and reference signal data such as frequency spectra.

Controller 38 may include a computer console or other device capable of controlling the operation of control/acquisition system 18. Controller 38 is connected to and controls the operation of T/R switch 36, transmitter 40, power amplifier 44, receiver 48, pre-amplifier 50, and attenuators 46, 56, among others. Controller 38 is configured to set T/R switch to a transmit state during a transmit phase of operation, and to a receive state during a receive phase of operation. Controller 38 is also configured to control NMR measurement pulse sequences and reference signals generated by transmitter 40, as well as signal analysis and/or data acquisition performed by receiver 48. Controller 38 is further configured to generate gating signals controlling the states (on/off) and operating parameters of amplifiers 44, 50 and attenuators 46, 56. In some embodiments, attenuator 56 may be fixed (and thus not under the control of controller 38), or omitted altogether. Controller 38 may also be connected to probe 20, for example for performing tuning/matching adjustments and for detecting probe parameters such as the settings of probe components such as tuning/matching capacitors and/or inductors. In some embodiments, controller 38 is configured to adjust reference signal parameters (e.g. the signal amplitude) according to detected probe settings, such as tuning/matching component settings, for example according to a look-up table correlating probe settings to synthetic reference signal parameters, as described below. In some embodiments, for example if reference signal couplers 52, 54 include one or more switches, controller 38 may also be connected to and control the operation of one or both of the switches.

Transmit-path reference-signal coupler 52 has three ports: an input port connected to transmitter 40, an output (transmitted) port connected to amplifier 44 through attenuator 46, and a coupled port connected to receive-path reference signal coupler 54 through reference signal coupling connection 58. Receive-path reference signal coupler 54 has three ports: an input port connected to receiver 48, an output (transmitted) port connected to probe 20, and a coupled port connected to transmit-path reference signal coupler 52 through reference signal coupling connection 58.

In a transmit phase of operation of spectrometer 12, T/R switch 36 connects transmitter 40 to probe 20, power amplifier 44 is turned on, and pre-amplifier 50 is off. Transmit-path reference signal coupler 52 transmits NMR measurement pulses received from transmitter 40 to power amplifier 44. The pulses are amplified and transmitted to probe 20 through receive-path reference signal coupler 52. The attenuation imparted by attenuator 56 is set to a relatively high value, in order to attenuate the signal coupled back by coupler 54 through connection 58. Preferably, the back-coupled signal is attenuated by more than the gain of power amplifier 44, and the signal coupled back into transmitter 40 is small relative to the signal generated by transmitter 40. In some embodiments, attenuator 56 may be replaced by or used in conjunction with a switch.

In a receive phase of operation of spectrometer 12, T/R switch 36 connects probe 20 to receiver 48, power amplifier 44 is off, and pre-amplifier 50 is on. Transmit-path reference signal coupler 52 receives a synthetic reference signal from transmitter 40, and transmits the reference signal to receive-path reference signal coupler 54 over reference signal coupling connection 58. Receive-path reference signal coupler 54 couples the reference signal into the receive path and transmits the reference signal to pre-amplifier 50. Receive-path reference signal coupler 54 also transmits NMR measurement response signals received from probe 20 to pre-amplifier 50. Pre-amplifier 50 amplifies the received synthetic reference signal and NMR measurement response signals and transmits the amplified signals to receiver 48.

The synthetic reference signal may be a linearly-phase-modulated waveform. The slope of a phase ramp applied to the waveform may be used to change the synthetic reference signal frequency, in order to move the reference signal frequency away from the NMR frequency or frequencies of interest, so that the reference signal does not overlap or appear in the spectral region of interest (e.g. the $^1$H spectral region). The reference RF signal may be offset by several kHz from the spectral region of interest. The reference signal amplitude may be controlled to decay with a predetermined rate by controlling the amplitude pattern of the reference signal waveform generated by transmitter 40.

In embodiments employing homonuclear decoupling, a synthetic reference signal may be applied selectively during the receive phases, but not during the decoupling (transmit) phases which alternate with the receive phases of operation. Homonuclear decoupling is a time-sharing scheme in which an initial excitation pulse sequence is followed by a sequence of alternating receive and decoupling (transmit) phases.

In some embodiments, to compensate for RF observe signal amplitude variations caused by sample losses and probe tuning characteristics, an amplitude correction may be applied electronically, using transmitter 40, to the synthetic reference signal, according to one or more dynamically-measured probe parameters. The probe parameters are measured during the operating lifetime of the NMR spectrometer, and not merely measured once during a manufacture/assembly of the spectrometer. In particular, suitable probe parameters include parameters indicative of probe losses, such as parameters indicative of an NMR measurement circuit Q-factor. Such probe losses may depend on the sample solvents and other sample and/or variable probe characteristics. Indicators of probe losses may include pw90 values, Q values, as well as tuning component positions or values of other parameters (e.g. capacitance, inductance) of tuning elements, indicative of probe losses.

The reference signal amplitude correction may be applied so as to account for probe losses that depend on sample characteristics. Generally, the probe receptivity (the probe efficiency during the receive phase) is reflected in the pw90 time corresponding to a sample. The transmit pw90 time for a sample can serve as an indicator of the probe receptivity for that sample, according to the reciprocity principle described for example by Holt et al. in the article "The Signal-to-Noise of the Nuclear Magnetic Resonance Experiment," *J. Magnetic Resonance* 24:71-85, (1976). The reference signal amplitude may be scaled by the same scaling factor as the pw90 times for different samples. For example, if a sample without salt corresponds to a pw90 time of 20 µs and a salty sample corresponds to a pw90 time of 25 µs, the reference signal amplitude for the salty sample may be set to be 80% of the reference signal amplitude for the sample without salt. In some embodiments, sample pw90 values are measured/calibrated, and the reference signal amplitude is chosen according to the measured sample pw90 values. In some embodiments, the probe Q or another indicator of probe losses may be measured directly or inferred from tuning/matching parameter values, and the reference signal amplitude is chosen according to the measured or inferred indicator of probe losses. Tuning/matching parameters may include tuning and/or impedance-matching parameter values such as the capacitance values of variable capacitors used to adjust probe tuning and/or impedance-matching characteristics. In some embodiments, the reference signal amplitude is chosen according to a predetermined look-up table relating values of tuning/matching component parameters (e.g. tuning/matching capacitor values) to reference signal amplitudes. The current values of the tuning/matching component parameters are identified, and the reference signal amplitude is set to a value indicated by the look-up table, directly or by interpolation, to correspond to the identified current tuning/matching component parameter values.

In some embodiments, both reference signal couplers 52, 54 may be formed by passive directional couplers. For a passive directional coupler, ideally signals incident on the input port are split between the transmitted and coupled ports, as illustrated for example for reference signal coupler 54 in FIG. 5-A, while signals received by the transmitted port or coupled port are transmitted to the input port, as illustrated schematically in FIGS. 5-B-C. The input port signal fraction coupled out to the coupled port generally has a predefined value which in exemplary embodiments may be between –50 dB and –20 dB, e.g. about –30 dB. The directivity of the coupler may be on the order of 20-40 dB, which corresponds to a transmitted port signal fraction coupled out to the coupled port that is 20-40 dB (e.g about 30 dB) lower than the corresponding fraction for the input port. For example, a coupler may have a forward-coupling attenuation of –50 dB and a backward coupling attenuation of –80 dB, which corresponds to a directivity of 30 dB.

In some embodiments, transmit-path reference signal coupler 52 may be a switch. For a switch, the attenuation between connected switch ports may be close to 0 dB, independently of which switch ports are connected. Employing a switch as reference signal coupler 52 may allow convenient independent control of the transmitted RF measurement and reference signal attenuations. If transmit-path reference signal coupler 52 is a switch, during the transmit phase of operation reference signal coupler 52 selectively connects transmitter 40 to power amplifier 44 and not to receive-path reference signal coupler 54. During the receive phase of operation, reference signal coupler 52 selectively connects transmitter 40 to receive-path reference signal coupler 54 and not to power amplifier 44.

FIG. 2-B shows a single-channel synthetic-reference NMR measurement circuit according to some embodiments of the present invention. The configuration of FIG. 2-B illustrates potential alternative choices for the locations of reference signal couplers 52, 54 according to some embodiments of the present invention. The control/acquisition system 118 shown in FIG. 2-B differs from the control/acquisition system 18 shown in FIG. 2-A in that, in the configuration of FIG. 2-B, receive-path reference signal coupler 54 is situated between T/R switch 36 and pre-amplifier 50, rather than between probe 20 and T/R switch 36, while transmit-path reference signal coupler 52 is situated between attenuator 46 and power amplifier 44. If receive-path reference signal coupler 54 is situated on the receiver side of T/R switch 36, rather than the probe side, reference signal coupler 54 is not subjected to transmit signals, which may allow a simplification of system design constraints. At the same time, in pre-existing NMR systems, it may be more practical to insert reference signal coupler 54 between T/R switch 36 and probe 20 as shown in FIG. 2-A for accessibility reasons, particularly if the circuit region between pre-amplifier 50 and T/R switch 36 is tightly integrated. Also, in the configuration of FIG. 2-A the reference signal samples T/R switch 36, thus allowing detection of problems or degradation in the performance of T/R switch 36. Generally, situating reference signal coupler 54 close to probe 20 allows sampling and thus identifying problems over a larger part of the receive path.

Figure 3:
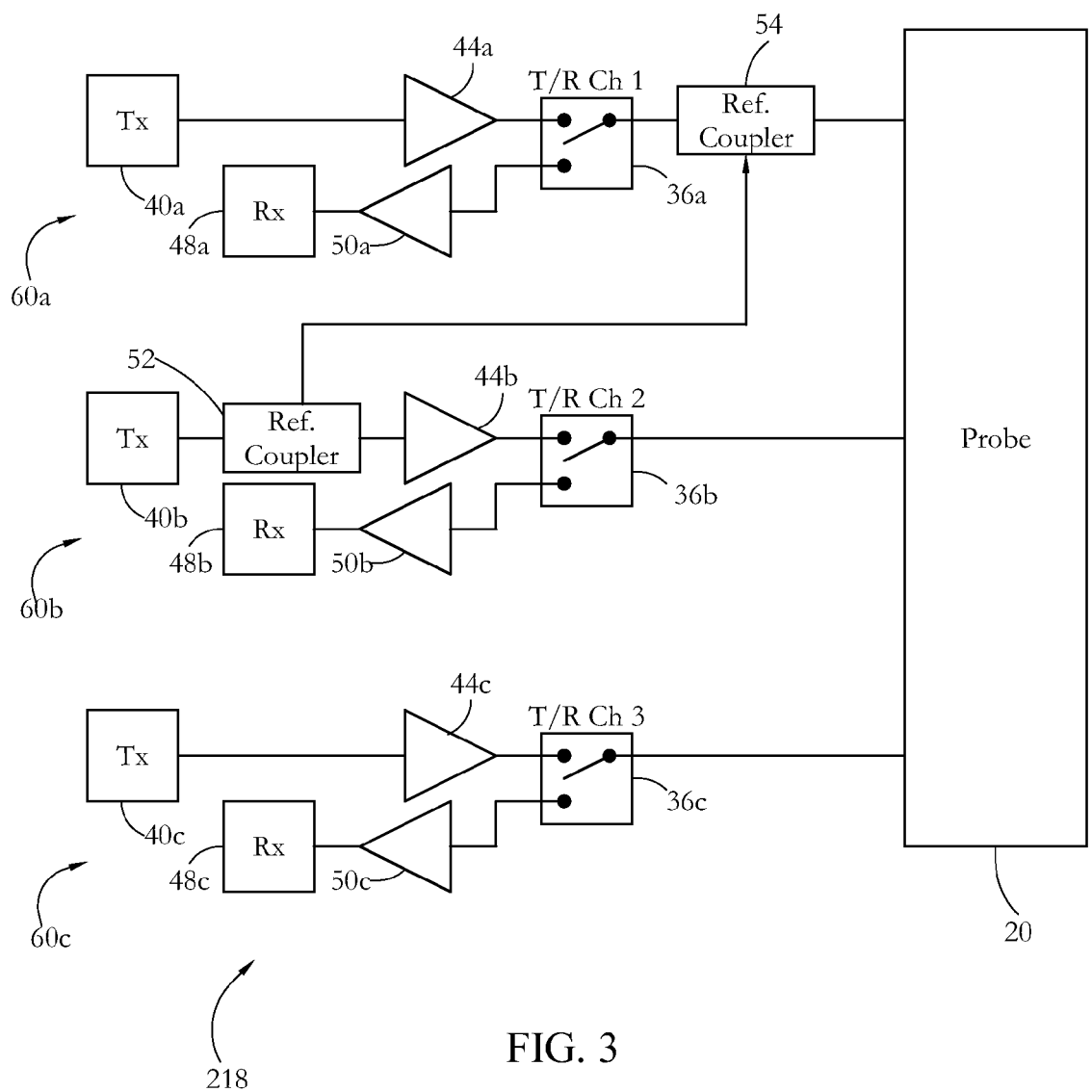
FIG. 3 shows a multi-channel synthetic-reference NMR measurement circuit according to some embodiments of the present invention.

In some embodiments, the reference signal may be generated by the transmitter of a different channel than the channel being used to detect the reference signal. FIG. 3 shows a multi-channel synthetic-reference NMR measurement circuit according to some embodiments of the present invention. A probe 20 is connected to three NMR channels 60a-c. Channels 60a-c include corresponding transmitters 40a-c, receivers 48a-c, and T/R switches 36a-c, as well as power amplifiers 44a-c connected between transmitters 40a-c and T/R switches 36a-c, respectively, and pre-amplifiers 50a-c connected between T/R switches 36a-c and receivers 48a-c, respectively. A receive-path reference signal coupler 54 is situated in the receive path of channel 60a, while a transmit-path reference signal coupler 52 is situated in the transmit path of channel 60b. Phase coherence between the reference signal applied using transmitter 40a and the NMR measurement signal received in response to NMR measurement pulses applied using transmitter 40b may be achieved by splitting the signal from a common frequency synthesizer and using separate amplitude/phase modulators for each channel. Such an arrangement may increase the difficulty of using the same channel for both referencing and decoupling.

In some embodiments, receive-path reference coupler 54 is situated on the probe side of any transmit or receive-path RF filters in channel 1. One or more RF filters may be present between T/R switch 36a and reference signal coupler 54, between T/R switch 36a and pre-amplifier 50a, and/or between T/R switch 36a and power amplifier 44a. Also, transmit-path reference coupler 52 is situated on the transmitter side of any RF filters in channel 2. If for example channel 2 is a carbon channel and channel 1 is a proton channel, the proton channel reference signal generated using the carbon channel transmitter (60b) is coupled out of channel 2 before any RF filters in channel 2 attenuate the proton reference signal. In addition, attenuator and other component parameter values may be chosen so that the total attenuation over any potential signal loop exceeds the total gain over that loop for the frequency range of interest, in order to prevent destructive amplifier oscillations. Such potential loops may be created through probe 20. For example, part of a transmit signal incident on the channel 2 port of probe 20 may become coupled out of the channel 1 port of probe 20 and arrive at reference signal coupler 54 from probe 20.

Figure 4:
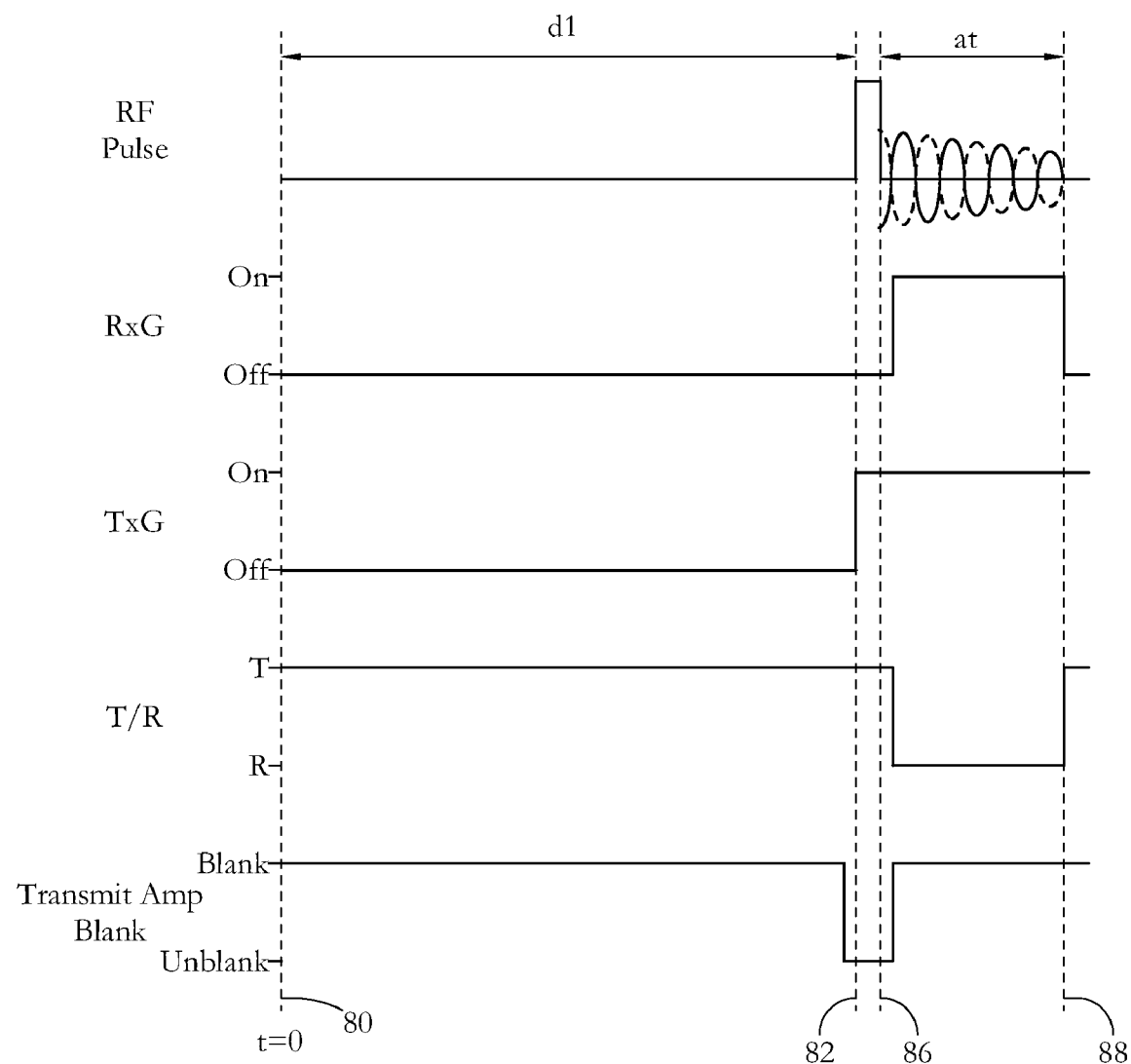
FIG. 4 illustrates a timing diagram for an exemplary NMR RF pulse sequence and associated reference control signals according to some embodiments of the present invention.

FIG. 4 illustrates a timing diagram for an exemplary NMR RF one-pulse sequence and associated control signals according to some embodiments of the present invention. The top timeline in FIG. 4 shows an exemplary one-pulse measurement sequence, while the following timelines show a number a number of gate signals. A relaxation delay d1 starting at time t=0 (illustrated by a line 80) is followed by an observe RF pulse between the times defined by lines 82, 86 in FIG. 4, followed by an acquisition time at between the times defined by lines 86, 88 in FIG. 4. The second timeline in FIG. 4 represents the state of a receiver mixer gate signal RxG. The gate signal RxG effectively turns off receiver 48 (FIG. 2-A) until the acquisition time at, when receiver 48 is turned on with a delay of a few microseconds after the observe RF pulse. At the end of the acquisition time at receiver 48 is effectively turned off.

The third timeline in FIG. 4 represents the state of a transmitter gate signal TxG. The gate signal TxG is turned on during the observe RF pulse to allow application of the observe RF pulse, and again during the acquisition time at to allow application of the synthetic reference signal. The next timeline in FIG. 4 represents the state of T/R switch 36 (FIG. 2-A). T/R switch 36 is set to a transmit (T) state during the relaxation delay d1, the observe RF pulse, and brief pre- and post-pulse delays, and is set to a receive state (R) during the acquisition time at. The final timeline in FIG. 4 represents the state of a blank/unblank line of transmit amplifier (power amplifier) 44 (FIG. 2-A). Power amplifier 44 is kept in a blanked (off) state during the acquisition time at, so that the synthetic reference RF signal does not perturb the spins in the NMR sample. The transmit amplifier blank/unblank line is gated so that transmit amplifier 44 is unblanked (on) during the observe RF pulse and a few microseconds before and after the observe RF pulse. The amplifier blanking line provides RF isolation during the observe RF pulse.

Exemplary systems and methods according to some embodiments described above allow performing electronically-referenced NMR experiments without permanently dedicating a full channel exclusively for the synthetic reference function, while providing control over the amplitude and other characteristics of the reference signal and allowing the reference signal to be substantially independent of probe isolation and other characteristics. In exemplary embodiments, a given channel of a multi-channel system as described above may be used to generate both decoupling pulses for one nucleus (e.g. carbon) and reference signals for a different nucleus (e.g. proton), without the need to recable connections between the two modes of operation.

Injecting a reference signal into the receive path, after the probe but before the receive amplifier, allows making the reference signal substantially independent of intra-probe interactions and probe isolation characteristics, and reduces the dynamic range of variations in sample NMR signals, particularly in broadband-tunable channels. At the same time, problems in the receive path caused by component degradation or other system anomalies can be detected by observing changes in detected reference signals. In a system in which a synthetically-generated reference signal is injected into the probe, complex interchannel interactions within the probe may introduce undesired variations in sample NMR signal intensities. In multi-channel systems, coupling the reference signal out of the signal path before the power amplifier and filters allows achieving a broader frequency range for the reference signal. Exemplary systems as described above can be particularly useful for quantitative analysis of samples having a relatively wide range of dielectric properties.

The above embodiments may be altered in many ways without departing from the scope of the invention. Accordingly, the scope of the invention should be determined by the following claims and their legal equivalents.

What is claimed is:

1. A nuclear magnetic resonance (NMR) apparatus comprising:
   a NMR probe;
   a transmit circuit comprising a transmit amplifier, for applying a set of NMR pulses to the NMR probe;
   a receive circuit comprising a receive amplifier, for detecting a response of the NMR probe to the set of applied NMR pulses;
   a transmit/receive switch electrically connecting the NMR probe alternatively to the transmit circuit and to the receive circuit, the transmit/receive switch being switchable between a receive state and a transmit state; and
   a receive-path reference signal coupler situated in a receive path between the NMR probe and the receive amplifier, for coupling a synthetic NMR reference signal into the receive path.

2. The apparatus of claim 1, further comprising a transmit-path reference signal coupler connected to the receive-path reference signal coupler and situated before the transmit amplifier in a transmit path defined by the transmit circuit, for coupling the synthetic NMR reference signal from the transmit path into the receive-path reference signal coupler.

3. The apparatus of claim 1, further comprising a transmit-path reference signal coupler connected to the receive-path reference signal coupler, for coupling the synthetic NMR reference signal into the receive-path reference signal coupler.

4. The apparatus of claim 3, wherein the receive-path reference signal coupler comprises a receive passive directional coupler having a receive coupling port, and wherein the transmit-path reference signal coupler comprises a transmit passive directional coupler having a transmit coupling port connected to the receive coupling port.

5. The apparatus of claim 3, wherein the receive-path reference signal coupler comprises a receive reference signal switch, and wherein the transmit-path reference signal coupler comprises a transmit reference signal switch.

6. The apparatus of claim 1, wherein the receive-path reference signal coupler comprises a passive directional coupler.

7. The apparatus of claim 1, wherein the receive-path reference signal coupler is situated between the NMR probe and the transmit/receive switch.

8. The apparatus of claim 1, further comprising a controller connected to the probe and configured to control a reference signal parameter according to a dynamically-measured probe parameter.

9. The apparatus of claim 8, wherein the reference signal parameter comprises a reference signal amplitude, and the probe parameter comprises an indicator of probe losses.

10. The apparatus of claim 1, further comprising a controller connected to the probe and configured to control an amplitude of the reference signal according to a set of dynamically-measured probe tuning/matching component parameters and according to a look-up table relating probe tuning/matching component parameter values to reference signal amplitudes.

11. The apparatus of claim 10, wherein the set of probe tuning component parameters includes an indicator of a tuning capacitor value.

12. A nuclear magnetic resonance (NMR) apparatus comprising:
    a NMR probe;
    a receive circuit comprising a receive amplifier, for detecting a response of the NMR probe to the set of applied NMR pulses; and
    a receive-path reference signal coupler situated in a receive path between the NMR probe and the receive amplifier, for coupling a synthetic NMR reference signal into the receive path.

13. A nuclear magnetic resonance (NMR) measurement method comprising:
    employing a transmit path to apply a set of NMR measurement pulses to a NMR probe during a transmit phase;
    employing a receive path to detect a response of the NMR probe to the applied NMR measurement pulses during a receive phase; and
    coupling a synthetic NMR reference signal into a receive-path reference signal coupler during the receive phase, the reference signal coupler being situated between the NMR probe and a receive amplifier of the receive path, whereby the synthetic NMR reference signal does not pass through an NMR measurement circuit of the NMR probe.

14. The method of claim 13, further comprising coupling the reference signal into the receive-path reference signal coupler from a transmit-path reference signal coupler situated before a transmit amplifier in the transmit path.

15. The method of claim 13, further comprising coupling the reference signal into the receive-path reference signal coupler from a transmit-path reference signal coupler.

16. The method of claim 15, wherein the receive-path reference signal coupler comprises a receive passive directional coupler having a receive coupling port, and wherein the transmit-path reference signal coupler comprises a transmit passive directional coupler having a transmit coupling port connected to the receive coupling port.

17. The method of claim 15, wherein the receive-path reference signal coupler comprises a receive reference signal switch, and wherein the transmit-path reference signal coupler comprises a transmit reference signal switch.

18. The method of claim 13, wherein the receive-path reference signal coupler comprises a passive directional coupler.

19. The method of claim 13, wherein the receive-path reference signal coupler is situated between the NMR probe and a transmit/receive switch, the transmit/receive switch connecting the NMR probe alternatively to the transmit path and the receive path.

20. The method of claim 13, further comprising controlling a reference signal parameter according to a dynamically-measured probe parameter.

21. The method of claim 20, wherein the reference signal parameter comprises a reference signal amplitude, and the probe parameter comprises an indicator of probe losses.

22. The method of claim 13, further comprising controlling an amplitude of the reference signal amplitude according to a set of dynamically-measured probe tuning/matching component parameters and according to a look-up table relating probe tuning/matching component parameter values to reference signal amplitudes.

23. The method of claim 22, wherein the set of probe tuning component parameters includes an indicator of a tuning capacitor value.

* * * * *